United States Patent
Miyashita (10) Patent No.: US 7,466,830 B2
(45) Date of Patent: Dec. 16, 2008

(54) EQUALIZING CIRCUIT AMPLIFYING BASS RANGE SIGNAL

(75) Inventor: Takashige Miyashita, Kyoto (JP)

(73) Assignee: Rohm Co., Ltd. (JP)

( * ) Notice: Subject to any disclaimer, the term of this patent is extended or adjusted under 35 U.S.C. 154(b) by 979 days.

(21) Appl. No.: 10/956,793

(22) Filed: Oct. 1, 2004

(65) Prior Publication Data

US 2005/0074133 A1  Apr. 7, 2005

(30) Foreign Application Priority Data

Oct. 6, 2003 (JP) .............................. 2003-347555

(51) Int. Cl.
*H03G 5/00* (2006.01)
(52) U.S. Cl. ............................ 381/103; 333/28; 381/98
(58) Field of Classification Search ................. 381/103, 381/97–99, 27, 61; 333/28
See application file for complete search history.

(56) References Cited

U.S. PATENT DOCUMENTS 5,330,769 A * 7/1994 McKinzie et al. ........... 424/605
5,872,830 A * 2/1999 Herrnsdorf .................. 378/207
6,718,039 B1 * 4/2004 Klayman et al. ............... 381/1
7,043,031 B2 * 5/2006 Klayman et al. .............. 381/98

OTHER PUBLICATIONS

Peter Kruger, "Microcomputer-controlled audio preamplifier", Electronics & Wireless World, Jun. 1989, pp. 584-587.

* cited by examiner

*Primary Examiner*—Vivian Chin
*Assistant Examiner*—Disler Paul
(74) *Attorney, Agent, or Firm*—Cantor Colburn LLP (57) ABSTRACT

A low-frequency eliminating unit outputs a signal derived from attenuating the extreme bass range in an input audio signal, so as to reduce bass distortion. A high-frequency retrieving unit retrieves, from the signal output from the low-frequency eliminating unit, signal components at frequencies higher than the marginal frequency. A front low-pass filter and a back low-pass filter retrieve, from the signal output from the low-frequency eliminating unit, components other than the signal retrieved by the high-frequency retrieving unit. An amplifying unit amplifies a signal output from the low-frequency retrieving unit. A synthesizing unit synthesizes a signal output from the high-frequency retrieving unit and a signal output from the amplifying unit.

18 Claims, 4 Drawing Sheets

EQUALIZING CIRCUIT AMPLIFYING BASS RANGE SIGNAL

BACKGROUND OF THE INVENTION

1. Field of the Invention

The present invention generally relates to equalizing circuits and, more particularly, to an equalizing circuit for amplifying bass range.

2. Description of the Related Art

In recent years, liquid crystal television sets and plasma display television sets have appeared in the market and are replacing CRT television sets. With the appearance of these television sets, increase in the screen size of a television set and reduction in the thickness thereof are facilitated. Under these circumstances, the size and installed position of an enclosure for a speaker in a television set are subject to increasingly rigid constrains. Since the size of enclosure is generally becoming smaller, reproduction of rich bass sound and creation of a sense of realism have become difficult. Generally, the human auditory system is less sensitive to bass sound. For this reason, there is likelihood that bass range sound cannot be heard unless the sound pressure is increased. There is proposed a preamplifier in which two operational amplifiers are in a cascade connection in order to amplify a bass range signal. This preamplifier is capable of amplifying a signal at 100 Hz or lower (See, for example, Reference (1) in the following Related Art List).

3. Related Art List (1) "Microcomputer controlled audio preamplifier", Peter Kruger, Electronics and Wireless World, June 1989, pp. 584-587

However, the related-art preamplifier amplifies signals at extremely low frequencies so that bass distortion associated with the driving of a speaker is also amplified. A band-pass filter preset to have a central frequency of 100 Hz or the neighborhood may be used to suppress bass distortion. If the band-pass filter has a high filter Q-factor, the frequency bandwidth is narrowed so that sufficient sound quality cannot be obtained. Decreasing the Q-factor of the filter affects a vocal frequency band at 300 Hz and higher. This results in both the bass range and the vocal frequency band being amplified so that sufficient sound quality cannot be obtained. An alternative approach is to separate a signal in the bass range and that of the vocal frequency band by a filter so that the signal in the bass range is amplified and then combined with the signal in the vocal frequency band afterwards. In this case, phase rotation occurs in the filter so that a dip occurs, in which the phase of the amplified signal and that of the vocal frequency band are reversed with respect to each other so that the signal components cancel each other. As a result, the sound quality is degraded.

SUMMARY OF THE INVENTION

The present invention is done in view of these circumstances and its object is to provide an equalizing circuit for amplifying a signal in the bass range while reducing its effects on a signal in the vocal frequency band.

One mode of practicing the invention is an equalizing circuit. The equalizing circuit according to the invention comprises: an input unit for receiving a signal subject to a process; a high-frequency retrieving unit for retrieving, from the input signal, a signal at a frequency equal to or higher than a first cutoff frequency determined on the basis of a marginal frequency of a speaker provided at a back end; a low-frequency retrieving unit for retrieving, from the input signal, a signal at a frequency equal to or lower than a second cutoff frequency determined on the basis of the first cutoff frequency and of a frequency of audio signal to be reproduced by the speaker, in accordance with an attenuation slope for removing components at frequencies equal to or higher than the frequency of the audio signal to be reproduced by the speaker; an amplifying unit for amplifying the retrieved signal at a frequency equal to or lower than the second cutoff frequency; a synthesizing unit for synthesizing the amplified signal and the retrieved signal at a frequency equal to or higher than the first cutoff frequency. The low-frequency retrieving unit may comprise: a first low-pass filter for transmitting a signal at a frequency equal to or lower than a frequency which is lower than the second cutoff frequency, using a first filter order smaller than the filter order corresponding to the attenuation slope; a second low-pass filter for transmitting a signal at a frequency equal to or lower than a frequency which is higher than the second cutoff frequency, using a second filter order larger than the first filter order, and wherein the input signal is transmitted through the first low-pass filter and then the second low-pass filter.

"The marginal frequency of a speaker" means the lower of the frequencies at which an output of the speaker drops. "The frequency of the audio signal to be reproduced by the speaker" means a parameter to be set by a designer. The phrase "determined on the basis of the first cutoff frequency and of the frequency of the audio signal to be reproduced by the speaker" refers to a case where the determination is made on the basis of a predetermined rule and a case where the determination is made by experiments. In the apparatus constructed as described above, the low-frequency retrieving unit uses two filters with small filter orders to retrieve low-frequency components of a signal. Accordingly, phase rotation is decreased and a phase difference with respect to high-frequency signal components is reduced so that a dip occurring as a result of synthesis is suppressed.

The equalizing circuit may further comprise: a low-frequency eliminating unit for retrieving, from the input signals, a plurality of signals at frequencies equal to or higher than a third cutoff frequency determined on the basis of the lowest frequency to be reproduced by the speaker; and a branch unit for supplying the signals from the low-frequency eliminating unit at frequencies equal to or higher than the third cutoff frequency to the high-frequency retrieving unit and the low-frequency retrieving unit, respectively. The second filter order in the low-frequency retrieving unit may be set as a subtraction of the first filter order from the filter order corresponding to the attenuation slope.

Another mode of practicing the invention is an equalizing circuit. The equalizing circuit comprising: an input unit for receiving a plurality of signals subject to a process; a high-frequency retrieving unit for retrieving, from the input signals, a plurality of signals at frequencies equal to or higher than a first cutoff frequency determined on the basis of a marginal frequency of a speaker provided at a back end; a low-frequency retrieving unit for retrieving, from the input signals, a signal at frequencies equal to or lower than a second cutoff frequency determined on the basis of the first cutoff frequency and of a frequency of audio signal to be reproduced by the speaker, in accordance with an attenuation slope for removing components at frequencies equal to or higher than the frequency of the audio signal to be reproduced by the speaker; an amplifying unit for amplifying the retrieved signal at frequencies equal to or lower than the second cutoff frequency; a synthesizing unit for synthesizing the amplified signal and each of the retrieved signals at frequencies equal to or higher than the first cutoff frequency. The low-frequency retrieving unit may comprise: a first low-pass filter for transmitting a signal at a frequency equal to or lower than a frequency which is lower than the second cutoff frequency, using a first filter order smaller than the filter order corresponding to the attenuation slope; a second low-pass filter for transmitting a signal at a frequency equal to or lower than a frequency which is higher than the second cutoff frequency, using a second filter order larger than the first filter order, and wherein the input signals are transmitted through the first low-pass filter, the signals transmitted by the first low-pass filter are synthesized and the synthesized signal is transmitted through the second low-pass filter.

In the apparatus constructed as described above, the low-frequency retrieving unit uses two filters with small filter orders to retrieve low-frequency components of a signal. Accordingly, phase rotation is decreased and a phase difference with respect to high-frequency signal components is reduced so that a dip occurring as a result of synthesis is suppressed.

The equalizing circuit may further comprise: a low-frequency eliminating unit for retrieving, from the input signals, a plurality of signals at frequencies equal to or higher than a third cutoff frequency determined on the basis of the lowest frequency to be reproduced by the speaker; and a branch unit for supplying the signals from the low-frequency eliminating unit at frequencies equal to or higher than the third cutoff frequency to the high-frequency retrieving unit and the low-frequency retrieving unit, respectively. The second filter order in the low-frequency retrieving unit may be set as a subtraction of the first filter order from the filter order corresponding to the attenuation slope. The low-frequency retrieving unit may comprise a high-pass filter for eliminating at least dc components from the signal obtained by synthesizing the signals transmitted by the first low-pass filter, and the low-frequency retrieving unit transmits the signal from which the dc components are eliminated through the second low-pass filter. The low-frequency retrieving unit may be provided with a high-pass filter for removing at least dc components from the signal transmitted through the second low-pass filter. The equalizing circuit may further comprise a control unit for controlling characteristics of the signal to be retrieved by the low-frequency retrieving unit. The equalizing circuit may comprise a control unit for controlling characteristics of the signal to be retrieved by the high-frequency retrieving unit. The equalizing circuit may further comprise: a receiving unit for receiving, from a user, instructions related to characteristics of the signal to be retrieved by the low-frequency retrieving unit or the high-frequency retrieving unit; and a converting unit for converting the received instructions into digital words, wherein the control unit controls the characteristics of the signal to be retrieved in accordance with the digital words. The equalizing circuit may further comprise an output unit for outputting the signals output from the synthesizing unit and the signal output from the low-frequency retrieving unit.

It is to be noted that any arbitrary combination of the above-described structural components and expressions changed between a method, an apparatus, a system, a computer program, a recording medium having stored computer programs therein, a data structure and so forth are all effective as and encompassed by the present embodiments.

Moreover, this summary of the invention does not necessarily describe all necessary features so that the invention may also be sub-combination of these described features.

DETAILED DESCRIPTION OF THE INVENTION

The invention will now be described based on the following embodiments which do not intend to limit the scope of the present invention but exemplify the invention. All of the features and the combinations thereof described in the embodiments are not necessarily essential to the invention.

A summary of the present invention will be given before going into specific details. An embodiment of the present invention relates to an audio reproduction apparatus for reproducing audio in a slim television set. Due to constraints derived from the configuration of the slim television set, an enclosure of a speaker included in the audio reproduction apparatus is relatively small. As a result of the small size of the enclosure, the marginal frequency is relatively high. The audio reproduction apparatus of the present invention has an objective of improving the sound quality of bass sound. Therefore, it is necessary to output signals at frequencies lower than the marginal frequency with a more or less sufficient sound pressure. Conversely, it is desirable that the sound pressure of bass distortion in a low-frequency range included in the bass range be suppressed. In order to achieve the above-mentioned objective, the audio reproduction apparatus includes an equalizing circuit. The equalizing circuit has an objective of resolving the aforementioned technical problem, reducing effects on the vocal frequency band and suppressing a dip. The equalizing circuit operates as follows. More specifically, the equalizing circuit receives a plurality of signals adapted for stereo output and eliminates bass range from the input plurality of signals. With this, bass distortion is prevented. The plurality of signals having bass distortion eliminated are fed to both a high-frequency retrieving unit and a low-frequency retrieving unit.

A high-frequency retrieving unit detects signals having components higher than the marginal frequency. That is, the high-frequency retrieving unit retrieves signals not requiring correction by the equalizing circuit. The low-frequency retrieving unit retrieves signals in the bass range to be amplified by the equalizing circuit. In this process, a filter with steep characteristics set up to have a cutoff frequency and an attenuation slope ensured not to affect the vocal frequency band on the high-frequency side is used. Further, in order to suppress a dip, i.e. in order to reduce a phase difference with respect to a signal output from the high-frequency retrieving unit, a filter having a filter order corresponding to the necessary attenuation slope is not used but two filters, a first low-pass filter and a second low-pass filter, having filter orders lower than the filter order corresponding to the necessary attenuation slope are used. Hereinafter, these filter orders will be referred to as a first filter order and a second filter order, wherein the first filter order is smaller than the second filter order. The first low-pass filter is set up to have a cutoff frequency lower than the cutoff frequency of the low-frequency retrieving unit. The second low-pass filter is set up to have a cutoff frequency higher than the cutoff frequency of the low-frequency retrieving unit.

The low-frequency retrieving unit with this construction allows an input signal to pass the first low-pass filter and then the second low-pass filter. For the purpose of reducing the circuit scale, the low-frequency retrieving unit synthesizes input signals and subjects the synthesized signal to the aforementioned process. A signal output from the low-frequency retrieving unit is amplified and then synthesized with a plurality of signals output from the high-frequency retrieving unit. The synthesized signal is output from a speaker.

Figure 1:
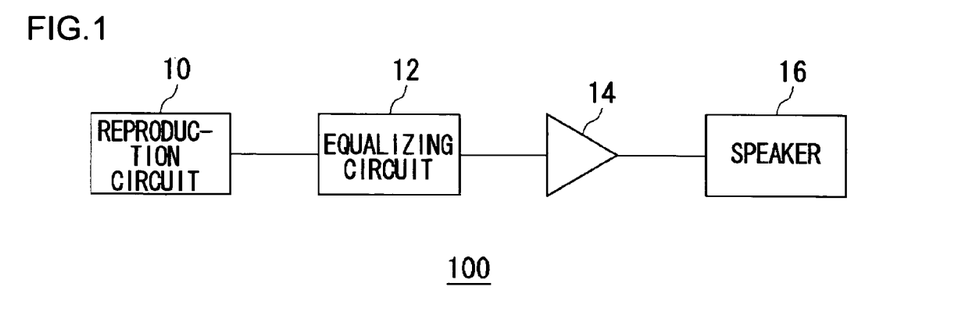
FIG. 1 shows a construction of an audio output apparatus according to an embodiment of the present invention.

FIG. 1 shows a construction of an audio output apparatus 100 according to the embodiment. The audio output apparatus 100 includes a reproduction circuit 10, an equalizing circuit 12, an amplifying unit 14 and a speaker 16. The audio output apparatus 100 may be a music playback apparatus such as a compact disc player capable of playing back music on its own. Alternatively, the apparatus 100 may be included in a television set for audio reproduction.

The reproduction circuit 10 plays back audio, on the basis of predetermined data. For example, a television set retrieves audio data from received data and outputs the audio data as an electrical signal. A compact disc player picks up music data recorded in a compact disc and outputs the music data as an electrical signal. The figure shows that the output signal is transmitted using a single signal line. Alternatively, two signals, one for right audio and the other for left audio for stereo playback may be transmitted.

The speaker 16 provides a final audio output audible to a user. For brevity of description, the marginal frequency of the speaker 16 is assumed to be 100 Hz. Generally, the speaker 16 is capable of outputting a signal at a frequency higher than the marginal frequency with a more or less sufficient sound pressure. The sound pressure at which a signal at a frequency lower than the marginal frequency (hereinafter, referred to as bass range) is output drops sharply with a decrease in the frequency. The speaker 16 is preceded by the amplifying unit 14 for amplifying the signal. Though the figure shows only one speaker 16, it is assumed that there are provided two speakers 16 corresponding to stereo reproduction and one speaker 16 corresponding to bass reproduction.

In order to improve the capabilities of the audio reproduction apparatus for bass sound reproduction, the sound pressure of the signal in the bass range reproduced by the speaker 16 should be increased. For this purpose, the equalizing circuit 12 amplifies the bass range signal. In other words, the equalizing circuit 12 provides to the signal the frequency characteristics opposite to the characteristics of the speaker 16. In order to suppress bass distortion occurring in the 10 Hz range, however, signal components at frequencies in which the bass distortion occurs (hereinafter, referred to as extreme bass range) are not amplified. The frequency range in the bass range subject to amplification is referred to as "reproduced bass range". In order to improve the bass sound quality, the more extensive the reproduced bass range, the better. The equalizing circuit 12 amplifies the signal in the bass range and operates to reduce effects on the signal in the vocal frequency band.

Figure 2:
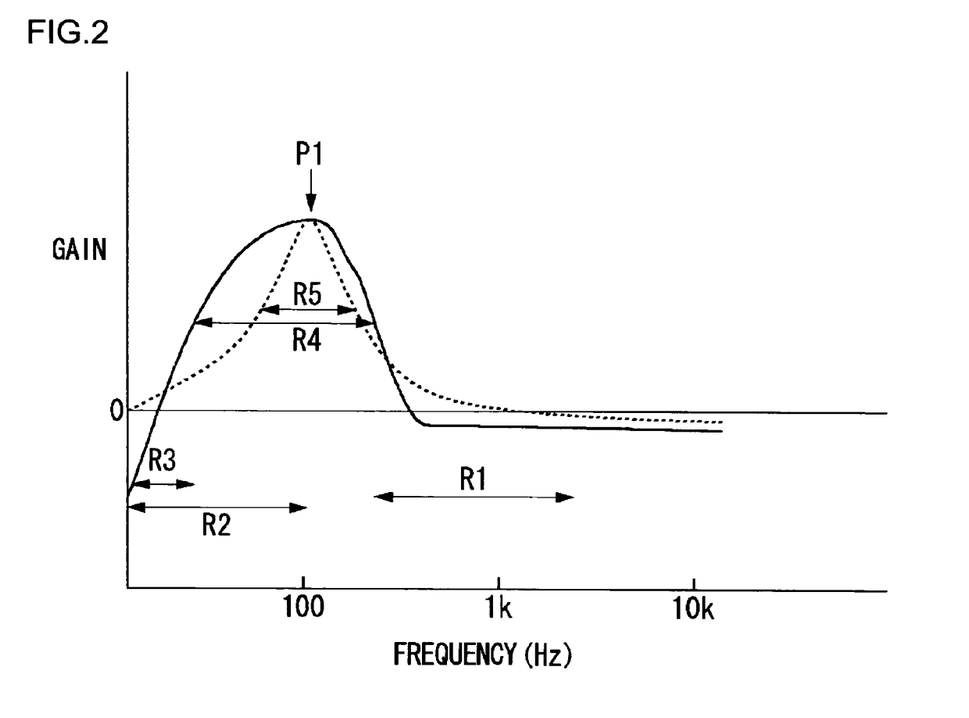
FIG. 2 shows frequency characteristics of an equalizing circuit of FIG. 1.

FIG. 2 shows frequency characteristics of the equalizing circuit 12. The solid line in the figure indicates the frequency characteristics of the equalizing circuit 12. The dotted line in the figure indicates the frequency characteristics of an equalizer not having the construction of the equalizing circuit 12 described later. P1 indicates a marginal frequency, R1 indicates a vocal frequency band, R2 indicates a bass range, R3 indicates an extreme bass range, and R4 and R5 indicate reproduced bass ranges. The characteristics of the equalizing circuit 12 illustrated in FIG. 2 will be described after the construction of the equalizing circuit 12 is described.

Figure 3:
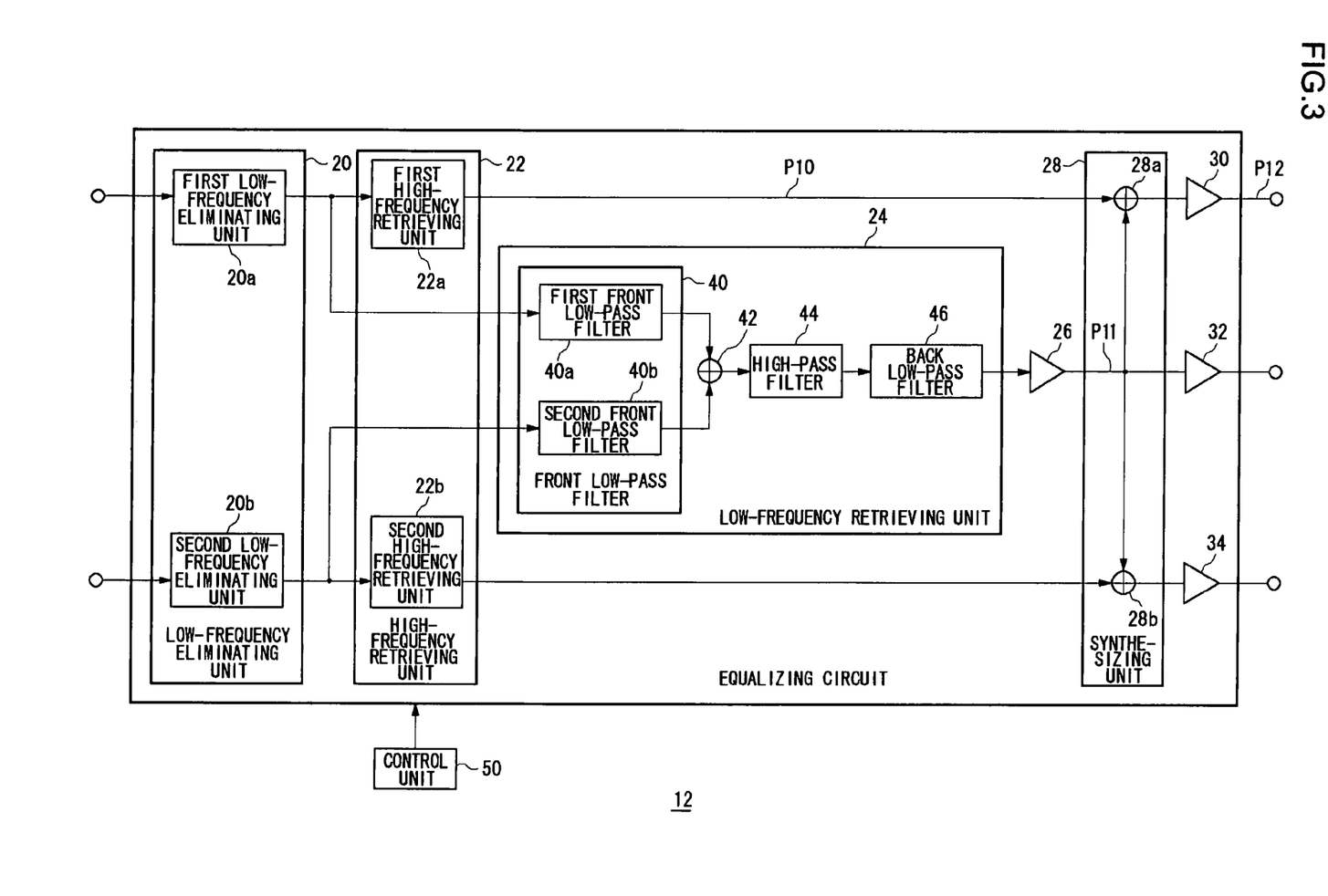
FIG. 3 shows a construction of the equalizing circuit of FIG. 1.

FIG. 3 shows a construction of the equalizing circuit 12. The equalizing circuit 12 includes: a first low-frequency eliminating unit 20a and a second low-frequency eliminating unit 20b, generically referred to as a low-frequency eliminating unit 20; a first high-frequency retrieving unit 22a and a second high-frequency retrieving unit 22b, generically referred to as a high-frequency retrieving unit 22; a low-frequency retrieving unit 24; an amplifying unit 26; a first synthesizing unit 28a and a second synthesized unit 28b, generically referred to as a synthesizing unit 28; a buffer 30; a buffer 32; a buffer 34 and a control unit 50. The low-frequency retrieving unit 24 includes: a first front low-pass filter 40a, a second front low-pass filter 40b, generically referred to as a front low-pass filter 40; a synthesizing unit 42, a high-pass filter 44 and a back low-pass filter 46. It is assumed that the equalizing circuit 12 receives from the reproduction circuit 10 a right audio signal and a left audio signal for stereo reproduction.

The low-frequency eliminating unit 20 outputs a signal derived from attenuating the extreme bass range in the input audio signal, so as to reduce bass distortion. In this case, a first-order high-pass filter with a cutoff frequency set at the lowest frequency to be reproduced by the speaker 16 is used.

The high-frequency retrieving unit 22 retrieves, from the signal output from the low-frequency eliminating unit 20, signal components at frequencies higher than the marginal frequency. That is, the high-frequency retrieving unit 22 retrieves a signal which is in the frequency range reproducible by the speaker 16 without any problem and which is basically not subject to any processing. In this case, a second-order high-pass filter with a cutoff frequency set at the marginal frequency is used.

The front low-pass filter 40 and the back low-pass filter 46 retrieve, from the signal output from the low-frequency eliminating unit 20, components other than the signal retrieved by the high-frequency retrieving unit 22. The signal thus retrieved is amplified for improvement of bass reproduction capabilities of the speaker 16. The cutoff frequency (hereinafter, referred to as separation cutoff frequency) of the low-frequency retrieving unit 24 including the front low-pass filter 40 and the back low-pass filter 46 should be determined on the basis of the marginal frequency and the vocal range. The separation cutoff frequency is determined such that the frequency characteristics of the signal output from the equalizing circuit 12 are indicated by the solid line of FIG. 2. It is assumed that an appropriate separation cutoff frequency is established through experiments or the like. The attenuation slope of the low-frequency retrieving unit 24 should be established so as to prevent the signal output from the low-frequency retrieving unit 24 from affecting the signal output from the high-frequency retrieving unit 22. It is assumed that the attenuation slope and the corresponding orders of low-pass filter (hereinafter, referred to as final filter order) are established through experiments or the like.

The cutoff frequency of the front low-pass filter 40 is set to be lower than the separation cutoff frequency. The cutoff frequency of the back low-pass filter 46 is set to be higher than the separation cutoff frequency. Since the separation cutoff frequency is set to be higher than the marginal frequency, the cutoff frequency of the front low-pass filter 40 is set at the marginal frequency. The filter order of the front low-pass filter 40 is set as a first filter order smaller than the final filter order. The filter order of the back low-pass filter 46 is set as a second filter order smaller than the final filter order. The first filter order is set to be smaller than the second filter order and a sum of the first filter order and the second filter order is set to be equal to the final filter order. It is assumed here that the final filter order is fifth so that the first filter order is set to two and the second filter order is set to three. By ensuring that the cutoff frequency of the low-frequency eliminating unit 20 is low and the separation cutoff frequency of the low-frequency retrieving unit 24 is high, it is ensured that the reproduced bass range is relatively extensive.

The signal output from the low-frequency eliminating unit 20 is transmitted through the front low-pass filter 40 and the back low-pass filter 46. The synthesizing unit 42 synthesizes the outputs of the front low-pass filter 40. This is because auditory perception is localized to the center in the bass range so that there is no problem in processing the sum signal. The high-pass filter 44 is responsible for eliminating dc components that maybe included in the signal synthesized by the synthesizing unit 42. In a similar configuration as the low-frequency eliminating unit 20, a first order high-pass filter with a cutoff frequency set at the lowest frequency to be reproduced by the speaker 16 is used.

The amplifying unit 26 amplifies the signal output from the low-frequency retrieving unit 24. The synthesizing unit 28 synthesizes the signal output from the high-frequency retrieving unit 22 and the signal output from the amplifying unit 26. The buffer 30 buffers the signal synthesized by the first synthesizing unit 28a. The buffer 32 buffers the signal amplified by the amplifying unit 26. The buffer 34 buffers the signal synthesized by the second synthesizing unit 28b. The signal from the buffer 30 forms a left output, the signal from the buffer 34 forms a right output and the signal from buffer 32 forms a bass output.

The control unit 50 accepts, via an input interface (not shown), user-originated instructions related to the characteristics of signals retrieved by the high-frequency retrieving unit 22 and the low-frequency retrieving unit 24, the characteristics including the cutoff frequency, Q factor and gain of the high-frequency retrieving unit 22, the front low-pass filter 40, the high-pass filter 44 and the back low-pass filter 46. The control unit 50 converts the instructions into digital words and electronically controls the high-frequency retrieving unit 22, the front low-pass filter 40, the high-pass filter 44 and the back low-pass filter 46 in accordance with the digital words.

Figure 4:
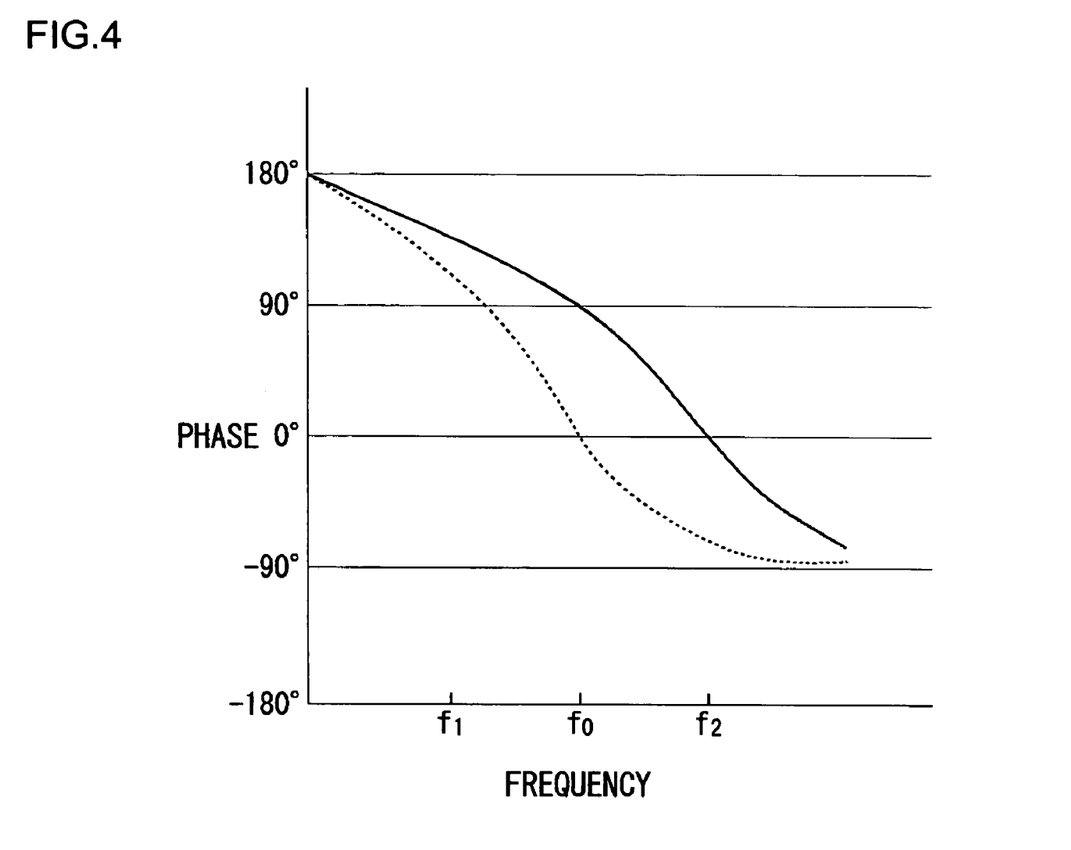
FIG. 4 shows frequency characteristics of a front low-pass filter and a back low-pass filter with respect to phase shifts.

FIG. 4 shows frequency characteristics of the front low-pass filter 40 and the back low-pass filter 46 with respect to phase shifts. For brevity of explanation, the solid line indicates phase characteristics in which the filter order corresponding to the front low-pass filter 40 is the first order and the filter order corresponding to the back low-pass filter 46 is the second order. The dotted line indicates phase characteristics in which the high-order filter is a third-order filter. The frequency indicated by "f0" in the figure is the cutoff frequency of the third-order filter and the frequency indicated by "f1" is the cutoff frequency of the first-order filter corresponding to the front low-pass filter 40. The frequency indicated by "f2" is the cutoff frequency of the second-order filter corresponding to the back low-pass filter 46. As illustrated, phase shift is decreased by combining low-order filters characterized by different cutoff frequencies. By ensuring that a lower-order filter has a lower cutoff frequency in combining the filters, phase shift in the low-frequency range is further decreased. Phase shift in the high-frequency range is relatively large. Since the gain of output from the low-frequency retrieving unit 24 is smaller in the high-frequency range extending into the vocal frequency band, effects from phase shift is limited.

Figure 5A:
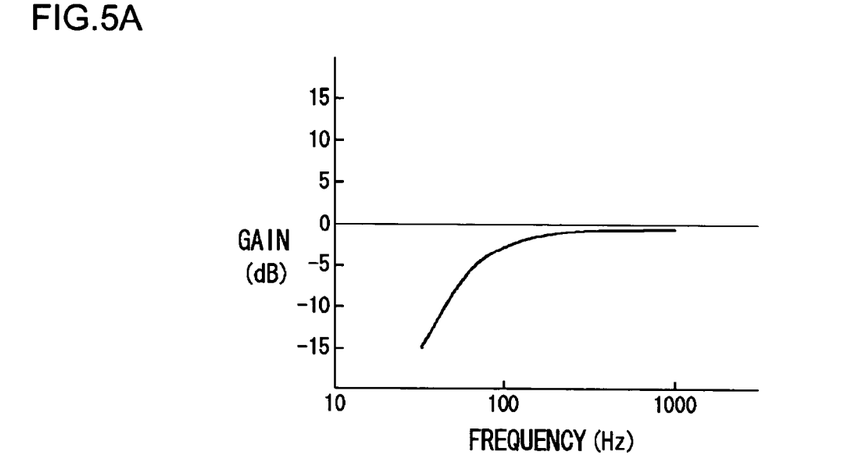
FIG. 5A-5C show frequency characteristics of the equalizing circuit.
Figure 5B:
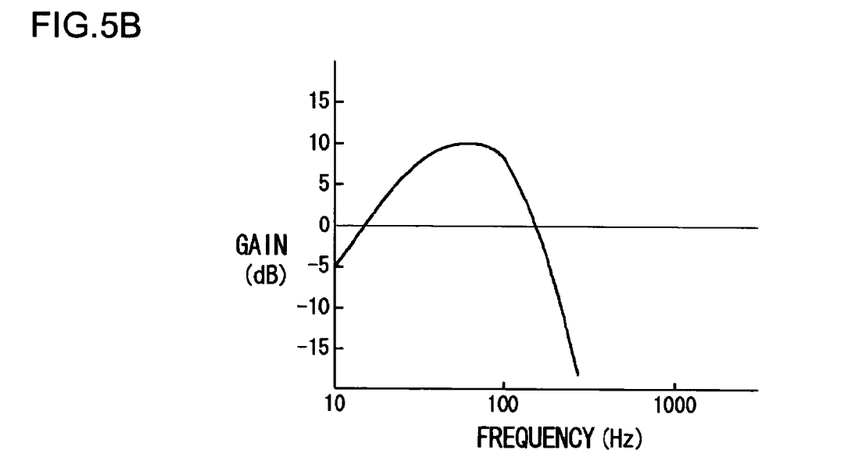
Figure 5C:
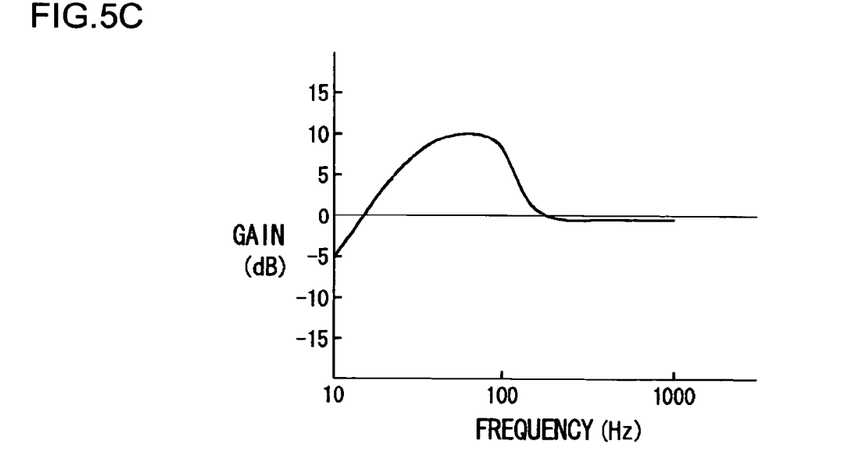

FIG. 5A-5C show frequency characteristics of the equalizing circuit 12. FIG. 5A shows frequency characteristics at node "P10" of FIG. 3, i.e. the characteristics of an output signal from the high-frequency retrieving unit 22. FIG. 5B shows frequency characteristics at node "P11" of FIG. 3, i.e. the characteristics of an output signal from the amplifying unit 26. FIG. 5C shows frequency characteristics at node "P12" of FIG. 3, i.e. the characteristics of an output signal from the buffer 30. As shown, FIG. 5C is obtained as a synthesis of FIG. 5A and FIG. 5B. As a result, the gain in the extreme bass range is small and reproduced bass range is extended, as shown in FIG. 5B. A comparison of FIGS. 5A and 5C will immediately reveal that effects on the vocal frequency band are limited and a dip is small. The same frequency characteristics as shown in FIG. 5C is also indicated by the solid line of FIG. 2. In comparison with the frequency characteristics indicated by the dotted line, the gain in the extreme bass range is small, the reproduced bass range is extensive, effects on the vocal frequency band are limited and a dip is small.

According to the embodiment of the present invention, a low-pass filter for isolating a signal subject to amplification is composed of a plurality of filters with low filter orders. Consequently, a phase difference with respect to the signal not subject to amplification is limited so that a dip is small. By providing a high-pass filter for eliminating the extreme bass range and a low-pass filter for isolating a signal subject to amplification, it is ensured that the reproduced bass range is extensive. By constructing the low-pass filter for isolating a signal subject to amplification with a filter with a large attenuation slope, effects on the vocal frequency band are reduced. Since a process relative to the bass range is effected on a synthesized signal, the circuit scale is successfully reduced.

Described above is an explanation based on the embodiment. The embodiment of the present invention is only illustrative in nature and it will be obvious to those skilled in the art that various variations in constituting elements and processes are possible within the scope of the present invention.

In the illustrated embodiment, the low-frequency retrieving unit 24 is constructed such that the high-pass filter 44 and the back low-pass filter 46 are arranged in the stated order. Alternatively, the back low-pass filter 46 and the high-pass filter 44 may be arranged in the stated order. A band-pass filter having similar characteristics may be used. According to the variations as described, similar characteristics are obtained using different circuit configurations. Different constructions may be employed as long as the desired characteristics are obtained.

In the illustrated embodiment, the equalizing circuit 12 receives a plurality of input signals and output a plurality of signals. Alternatively, the circuit may receive a single signal and output a single signal. In this case, each of the low-frequency eliminating unit 20, the high-frequency retrieving unit 22, the front low-pass filter 40 and the synthesizing unit 28 may include one constituting element. Still another alternative is to eliminate the synthesizing unit 42. According to the variations described above, the circuit scale is further reduced. An appropriate construction may be employed depending on whether stereo audio reproduction or monaural reproduction is desired.

Although the present invention has been described by way of exemplary embodiments, it should be understood that many changes and substitutions may further be made by those skilled in the art without departing from the scope of the present invention which is defined by the appended claims.

What is claimed is:

1. An equalizing circuit comprising:
   an input unit for receiving a signal subject to a process;
   a high-frequency retrieving unit for retrieving, from the input signal, a signal at a frequency equal to or higher than a first cutoff frequency determined on the basis of a marginal frequency of a speaker provided at a back end;
   a low-frequency retrieving unit for retrieving, from the input signal, a signal at a frequency equal to or lower than a second cutoff frequency determined on the basis of the first cutoff frequency and of a frequency of audio signal to be reproduced by the speaker, in accordance with an attenuation slope for removing components at frequencies equal to or higher than the frequency of the audio signal to be reproduced by the speaker;
   an amplifying unit for amplifying the retrieved signal at a frequency equal to or lower than the second cutoff frequency;
   a synthesizing unit for synthesizing the amplified signal and the retrieved signal at a frequency equal to or higher than the first cutoff frequency, wherein
   said low-frequency retrieving unit comprises: a first low-pass filter for transmitting a signal at a frequency equal to or lower than a frequency which is lower than the second cutoff frequency, using a first filter order smaller than the filter order corresponding to the attenuation slope; a second low-pass filter for transmitting a signal at a frequency equal to or lower than a frequency which is higher than the second cutoff frequency, using a second filter order larger than the first filter order, and wherein
   the input signal is transmitted through the first low-pass filter and then the second low-pass filter.

2. An equalizing circuit comprising:
   an input unit for receiving a plurality of signals subject to a process;
   a high-frequency retrieving unit for retrieving, from the input signals, a plurality of signals at frequencies equal to or higher than a first cutoff frequency determined on the basis of a marginal frequency of a speaker provided at a back end;
   a low-frequency retrieving unit for retrieving, from the input signals, a signal at frequencies equal to or lower than a second cutoff frequency determined on the basis of the first cutoff frequency and of a frequency of audio signal to be reproduced by the speaker, in accordance with an attenuation slope for removing components at frequencies equal to or higher than the frequency of the audio signal to be reproduced by the speaker;
   an amplifying unit for amplifying the retrieved signal at frequencies equal to or lower than the second cutoff frequency;
   a synthesizing unit for synthesizing the amplified signal and each of the retrieved signals at frequencies equal to or higher than the first cutoff frequency, wherein
   said low-frequency retrieving unit comprises: a first low-pass filter for transmitting a signal at a frequency equal to or lower than a frequency which is lower than the second cutoff frequency, using a first filter order smaller than the filter order corresponding to the attenuation slope; a second low-pass filter for transmitting a signal at a frequency equal to or lower than a frequency which is higher than the second cutoff frequency, using a second filter order larger than the first filter order, and wherein
   the input signals are transmitted through the first low-pass filter, the signals transmitted by the first low-pass filter are synthesized and the synthesized signal is transmitted through the second low-pass filter.

3. The equalizing circuit according to claim 2, further comprising:
   a low-frequency eliminating unit for retrieving, from the input signals, a plurality of signals at frequencies equal to or higher than a third cutoff frequency determined on the basis of the lowest frequency to be reproduced by the speaker; and
   a branch unit for supplying the signals from said low-frequency eliminating unit at frequencies equal to or higher than the third cutoff frequency to said high-frequency retrieving unit and said low-frequency retrieving unit, respectively.

4. The equalizing circuit according to claim 2, wherein the second filter order in said low-frequency retrieving unit is set as a subtraction of the first filter order from the filter order corresponding to the attenuation slope.

5. The equalizing circuit according to claim 3, wherein the second filter order in said low-frequency retrieving unit is set as a subtraction of the first filter order from the filter order corresponding to the attenuation slope.

6. The equalizing circuit according to claim 2, wherein said low-frequency retrieving unit comprises a high-pass filter for eliminating at least dc components from the signal obtained by synthesizing the signals transmitted by the first low-pass filter, and said low-frequency retrieving unit transmits the signal from which the dc components are eliminated through the second low-pass filter.

7. The equalizing circuit according to claim 3, wherein said low-frequency retrieving unit comprises a high-pass filter for eliminating at least dc components from the signal obtained by synthesizing the signals transmitted by the first low-pass filter, and said low-frequency retrieving unit transmits the signal from which the dc components are eliminated through the second low-pass filter.

8. The equalizing circuit according to claim 4, wherein said low-frequency retrieving unit comprises a high-pass filter for eliminating at least dc components from the signal obtained by synthesizing the signals transmitted by the first low-pass filter, and said low-frequency retrieving unit transmits the signal from which the dc components are eliminated through the second low-pass filter.

9. The equalizing circuit according to claim 2, wherein said low-frequency retrieving unit is provided with a high-pass filter for removing at least dc components from the signal transmitted through the second low-pass filter.

10. The equalizing circuit according to claim 3, wherein said low-frequency retrieving unit is provided with a high-pass filter for removing at least dc components from the signal transmitted through the second low-pass filter.

11. The equalizing circuit according to claim 4, wherein said low-frequency retrieving unit is provided with a high-pass filter for removing at least dc components from the signal transmitted through the second low-pass filter.

12. The equalizing circuit according to claim 2, further comprising a control unit for controlling characteristics of the signal to be retrieved by said low-frequency retrieving unit.

13. The equalizing circuit according to claim 3, further comprising a control unit for controlling characteristics of the signal to be retrieved by said low-frequency retrieving unit.

14. The equalizing circuit according to claim 2, further comprising a control unit for controlling characteristics of the signal to be retrieved by said high-frequency retrieving unit.

15. The equalizing circuit according to claim 3, further comprising a control unit for controlling characteristics of the signal to be retrieved by said high-frequency retrieving unit.

16. The equalizing circuit according to claim 12, further comprising:
  a receiving unit for receiving, from a user, instructions related to characteristics of the signal to be retrieved by said low-frequency retrieving unit or said high-frequency retrieving unit; and
  a converting unit for converting the received instructions into digital words, wherein
  said control unit controls the characteristics of the signal to be retrieved in accordance with the digital words.

17. The equalizing circuit according to claim 14, further comprising:
  a receiving unit for receiving, from a user, instructions related to characteristics of the signal to be retrieved by said low-frequency retrieving unit or said high-frequency retrieving unit; and
  a converting unit for converting the received instructions into digital words, wherein
  said control unit controls the characteristics of the signal to be retrieved in accordance with the digital words.

18. The equalizing circuit according to claim 2, further comprising an output unit for outputting the signals output from said synthesizing unit and the signal output from said low-frequency retrieving unit.

* * * * *